United States Patent
Grover

(10) Patent No.: US 6,703,292 B1
(45) Date of Patent: Mar. 9, 2004

(54) METHOD OF MAKING A SEMICONDUCTOR WAFER HAVING A DEPLETABLE MULTIPLE-REGION SEMICONDUCTOR MATERIAL

(75) Inventor: Raymond J. Grover, Manchester (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/615,873

(22) Filed: Jul. 13, 2000

(30) Foreign Application Priority Data

Jul. 14, 1999 (GB) .............................................. 9916370

(51) Int. Cl.⁷ ............................................ H01L 21/261
(52) U.S. Cl. ........................ 438/512; 438/415; 438/418
(58) Field of Search ................................ 438/512, 415, 438/418; 257/929

(56) References Cited

U.S. PATENT DOCUMENTS

| | | | |
|---|---|---|---|
| 3,255,050 A | * 6/1966 | Klahr | 438/512 |
| 3,967,982 A | * 7/1976 | Arndt et al. | 148/DIG. 165 |
| 4,348,351 A | * 9/1982 | Kramer | 376/183 |
| 4,728,371 A | 3/1988 | Haas et al. | 438/133 |
| 4,754,310 A | 6/1988 | Coe | 257/287 |
| 5,216,275 A | 6/1993 | Chen | 257/493 |
| 5,438,215 A | 8/1995 | Tihanyi | 257/401 |
| 6,027,953 A | * 2/2000 | Liao et al. | 438/36 |
| 6,028,329 A | * 2/2000 | Liao | 257/197 |
| 6,040,600 A | * 3/2000 | Uenishi et al. | 257/330 |
| 6,184,555 B1 | * 2/2001 | Tihanyi et al. | 257/342 |
| 6,274,456 B1 | * 8/2001 | Liao | 438/416 |
| 2001/0006831 A1 | * 7/2001 | Luo | 438/138 |

FOREIGN PATENT DOCUMENTS

| | | |
|---|---|---|
| DE | 19736981 A | 8/1998 |
| GB | 2309336 A | 7/1997 |
| WO | 9729518 A1 | 8/1997 |

* cited by examiner

Primary Examiner—Tom Thomas
Assistant Examiner—José R. Díaz
(74) Attorney, Agent, or Firm—Aaron Waxler

(57) ABSTRACT

Semiconductor devices are known comprising a multiple p-n junction RESURF semiconductor material (10) that provides a voltage-sustaining space-charge zone when depleted from a blocking junction (40). Charge balance is important in the alternating p-type (11) and n-type (12) regions which together provide the voltage-sustaining space-charge zone. The invention provides a low-cost yet reliable way of manufacturing such a material (10), and also devices with such a material (10). A p-type silicon body (100) having an acceptor doping concentration (Na) for the p-type regions (11) of the material is subjected to irradiation with collimated beams (152) of thermal neutrons (150) at window areas (52) in a mask (50) so as to form the n-type regions (12) by transmutation of silicon atoms into phosphorus. A well-defined and controllable phosphorus doping concentration to balance the low acceptor concentration of the p-type regions (11) is achievable in this manner, even when the acceptor concentration is of boron. The silicon body (10) so formed with the alternating p-type and n-type regions (11, 12) is sliced and/or polished transverse (110) to the p-n junctions (21) between the p-type and n-type regions (11,12) so as to form a wafer for device manufacture. The invention is particularly advantageous for the manufacture of high voltage MOSFETs having a low on-resistance.

8 Claims, 1 Drawing Sheet

METHOD OF MAKING A SEMICONDUCTOR WAFER HAVING A DEPLETABLE MULTIPLE-REGION SEMICONDUCTOR MATERIAL

BACKGROUND OF THE INVENTION

This invention relates to the manufacture of semiconductor devices with a depletable multiple-region semiconductor material that provides a voltage-sustaining space-charge zone when depleted, and to a method of fabricating such a material. The invention also relates to semiconductor material and semiconductor devices produced by such methods.

The voltage-sustaining space-charge zone results from charge-carrier depletion of interposed p-type and n-type regions that form multiple p-n junctions in the material. The intermediate dimensions (width or thickness) of the interposed p-type and n-type regions need to be small enough (in relation to their dopant concentrations) to allow depletion of the region across its intermediate dimension without the resulting electric field reaching the critical field strength at which avalanche breakdown would occur in that semiconductor. This is an extension of the famous RESURF principle. Thus, the depletable multiple-region material may be termed "multiple p-n RESURF" material. In the voltage-sustaining zone formed of first regions of one conductivity type interposed with second regions of the opposite conductivity type, the dopant concentration and dimensions of the first and second regions are such that (when depleted in a high voltage mode of operation) the space charge per unit area in the first and second regions balances at least to the extent that the electric field resulting from the space charge is less than the critical field strength at which avalanche breakdown would occur in that zone.

U.S. Pat. No. 4,754,310 (our ref: PHB32740) discloses semiconductor devices with depletable multiple-region (multiple p-n junction RESURF) semiconductor material comprising alternating p-type and n-type regions which together provide a voltage-sustaining space-charge zone when depleted. The use of such material for the space-charge zone permits the achievement of a lower on-resistance in the device having a given breakdown voltage and is particularly advantageous for high voltage MOSFET devices, both lateral devices and vertical devices. Other embodiments of such devices are disclosed in U.S. Pat. No. 5,216,275, U.S. Pat. No. 5,438,215 and WO-A-97/29518. The whole contents of U.S. Pat. No. 4,754,310, U.S. Pat. No. 5,216,275, U.S. Pat. No. 5,438,215 and WO-A-97/29518 are hereby incorporated herein as reference material.

As described in U.S. Pat. No. 4,754,310, U.S. Pat. No. 5,216,275, U.S. Pat. No. 5,438,215 and WO-A-97/29518, epitaxial refill of etched trenches may be used to provide the alternating p-type and n-type regions extending perpendicular to the major surface of the device body in the case of a vertical device. However, the quality of the resulting p-n junctions and the reproducibility of the process is far from optimum.

Some alternative processes for forming the depletable multiple regions at intermediate stages in the device manufacture have been proposed. Thus, instead of epitaxial refill of etched trenches in a silicon epitaxial layer on a highly doped silicon substrate, column 5 lines 38 to 41 of U.S. Pat. No. 5,216,275 suggests selective neutron transmutation doping (NTD) to transform local zones of the n(or p) silicon layer into p(or n) regions. However, the neutrons penetrate through the epitaxial layer to the highly doped silicon substrate, and so silicon atoms and dopant atoms in the highly doped silicon substrate are also transmutated. This substrate is however required to form an active device region (drain). FIGS. 7a to 7b of WO-A-97/29518 suggest using repeated epitaxy with ion implantation of the opposite type dopant at each epitaxial stage. However this process involves many steps and so is expensive, and it is difficult to achieve the balance of the n and p dopant that is needed for RESURF with the conductivity and voltage blocking requirements of the device.

Due to the closely matched p and n type doping in $cm^{-2}$ that is needed for the multiple RESURF, it is not obvious what known processes could be advantageously used in manufacture to fabricate the multiple p-n junction RESURF semiconductor material for vertical devices.

SUMMARY OF THE INVENTION

It is an aim of the present invention to provide a low-cost yet reliable process for fabricating the multiple p-n junction RESURF semiconductor material.

According to the present invention, there is provided a method of fabricating a semiconductor wafer of a depletable multiple-region semiconductor material comprising alternating p-type and n-type regions which together provide a voltage-sustaining space-charge zone when depleted, including the steps of providing a p-type silicon body having an acceptor doping concentration corresponding to that required for the p-type regions of the material across the thickness of the body, and subjecting the silicon body to irradiation with collimated beams of thermal neutrons at window areas in a mask so as to form the n-type regions by transmutation of silicon atoms into phosphorus, whereby the phosporus dopant concentration of the resulting n-type regions extends across the thickness of the body between the opposite major surfaces of the body so that the p-n junctions formed between the alternating p-type and n-type regions terminate at the opposite major surfaces of the body.

Very good control is possible over the composition of the original p-type silicon body, whose resistivity can be precisely measured to determine its correct (low) dopant concentration level before the local neutron transmutation doping (NTD) stage. The precise neutron dose for the desired NTD concentration of phosphorus can also be accurately calibrated. By using NTD in this manner to provide a starting wafer for device manufacture, problems arising from NTD of highly doped device regions/substrates do not arise. In the subsequent device manufacture, a highly doped region/substrate may be provided at a major surface of the wafer by dopant implantation and/or diffusion or by bonding a highly doped wafer to that major surface.

The body may be of a suitable thickness to form the desired wafer for device manufacture. However, thermal neutrons have a large penetration depth in silicon. Thus, a thicker body can readily be used for the NTD. Then, after the NTD, the method may include a further step of slicing the silicon body transverse to the p-n junctions between the p-type and n-type regions so as to form the desired device wafer as a thinner body.

A wafer fabricated in accordance with the invention can be advantageously used for the manufacture of a high voltage MOSFET device having a low on-resistance. Thus, source and drain regions my be provided adjacent to respective first and second opposite major faces of the wafer, the source region being separated from the multiple p-n junctions of the space-charge zone by a channel-accommodating body region of opposite conductivity type to the drain region. A wafer of a first conductivity type may be bonded to the second major surface of the wafer of the depletable multiple-region semiconductor material, so as to provide the drain region at said second major surface.

BRIEF DESCRIPTION OF THE DRAWINGS

These and other advantageous technical features in accordance with the present invention are set out in the appended claims. They are illustrated in embodiments now described, by way of example, with reference to the accompanying diagrammatic drawings, in which:

Figure 1:
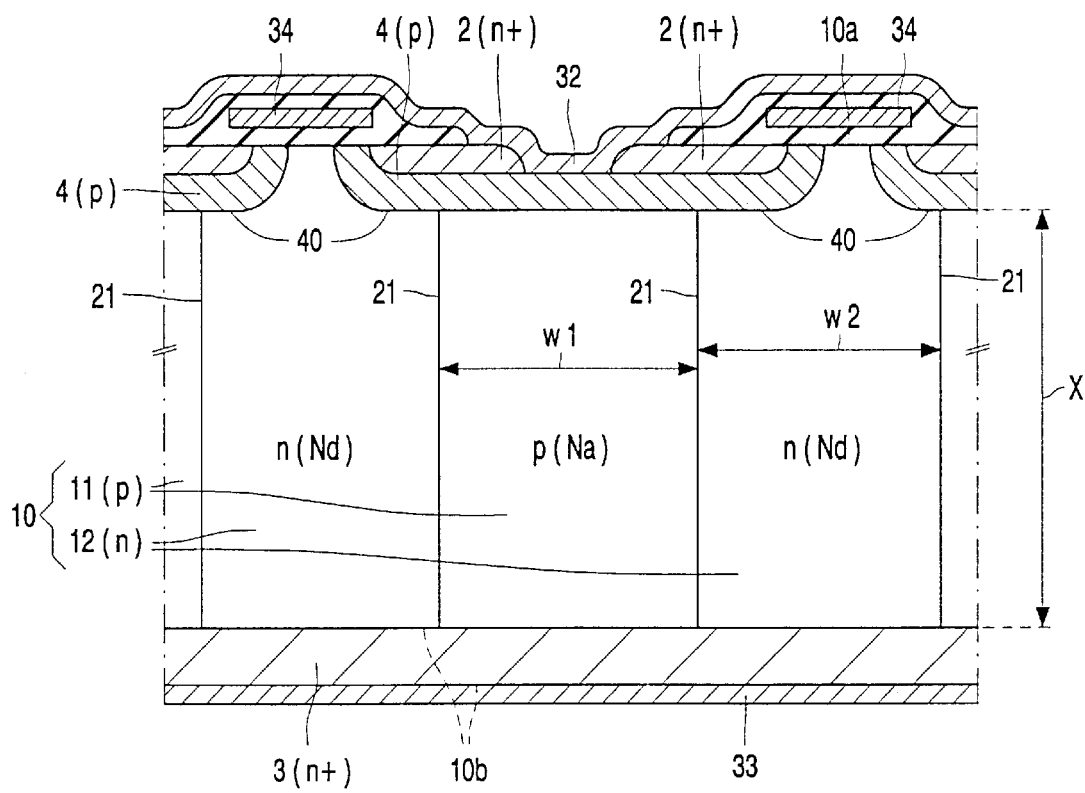
FIG. 1 is a cross-sectional view of part of a high voltage MOSFET device manufactured in accordance with the invention.

It should be noted that the Figures are diagrammatic, relative dimensions and proportions of parts of the drawings having been shown exaggerated or reduced in size, for the sake of clarity and convenience in the drawings. Thus, for example, the thickness X of the portion 10 is typically at least an order of magnitude larger than the widths w1 and w2 of its regions. The same reference signs are generally used to refer to corresponding or similar features in modified and different embodiments.

DESCRIPTION OF THE PREFERRED EMBODIMENTS

The MOSFET device of FIG. 1 includes a monocrystalline silicon body having a body portion 10 of a depletable multiple-region (multiple p-n junction RESURF) semiconductor material that comprises alternating p-type and n-type regions 11 and 12 respectively. The regions 11 and 12 together provide a voltage-sustaining space-charge zone when depleted in a blocking state of the MOSFET. This device is of the kind disclosed in U.S. Pat. No. 4,754,310, U.S. Pat. No. 5,216,275, U.S. Pat No. 5,438,215 and WO-A-97/29518. Typically the multiple RESURF semiconductor material may sustain blocking voltages in excess of 100 volts.

The MOSFET of FIG. 1 is a vertical device having source and drain regions 2 and 3 respectively, that are provided adjacent to opposite major faces 10a and 10b of the body portion 10. The insulated gate structure 34 and source electrode 32 of the MOSFET are present at the face 10a, while the drain electrode 33 is present at the face 10b. The p-n junctions 21 between the regions 11 and 12 extend transverse to the major surfaces 10a,10b of the body portion 10. The source region 2 is separated from the multiple p-n junctions 21 of the space-charge zone by a channel-accommodating body region 4. This transistor body region 4 is of opposite conductivity type to the drain region 3 and forms the blocking p-n junction 40 from which the depletion layer spreads in the body portion 10 in the blocking state of the MOSFET. When sustaining the blocking voltage, the whole of the body portion 10 is depleted and so is shown unhatched in FIG. 1. The depletion layer also extends slightly from the body portion 10 into the regions 3 and 4.

A method of fabricating a wafer for the body 10 of this device by a method in accordance with the present invention will now be described. This method includes the steps of:

(a) providing a p-type silicon crystal body 100 having opposite major surfaces 100a and 100b, the acceptor doping concentration Na, e.g. of boron, of the body 100 corresponding to that required for the p-type regions 11 of the material, (b) providing a neutron-absorbing mask 50 (see FIG. 2) over the surface 100a to mask areas of the silicon body 100 where the p-type regions are to be left, the mask 50 having window areas 52 where the n-type regions 12 are desired, the window areas 52 alternating with masking areas 51, (c) subjecting the silicon body 100 to irradiation with collimated beams 152 of thermal neutrons 150 at the window areas 52 in the mask 50 so as to form the n-type regions 12 having a donor doping concentration Nd, by transmutation of silicon atoms into phosphorus, and (d) slicing the silicon body 100 transverse to the p-n junctions 21 between the p-type and n-type regions 11 and 12 so as to form the wafer as a thinner body for device manufacture.

The transmutation of silicon atoms into phosphorus is a known doping process for silicon semiconductor material, and is normally used to convert the whole body into n-type phosphorus-doped material. United States patent specification U.S. Pat. No. 4,728,371 discloses a NTD process, in which different thicknesses of neutron absorbing material are on the silicon body during irradiation so as to adjust the uniform doping level of the n-type body region of, for example, a power thyristor. The whole contents of U.S. Pat. No. 4,728,371 are hereby incorporated herein as reference material. U.S. Pat. No. 5,216,275 suggested the use of NTD to form multiple p-n junction RESURF material, but in the context of transforming local zones of a n(or p) silicon layer into p(or n) regions, when the layer is present on a highly doped silicon substrate that provides a drain region of the device. The use of NTD in this known context produces secondary doping problems, for example in transmutating phosphorus dopant of a highly doped n-type substrate into sulphur. These problems are avoided in accordance with the present invention. The use of NTD in the context of the present invention will now be discussed in more detail, with reference to FIG. 2.

Figure 2:
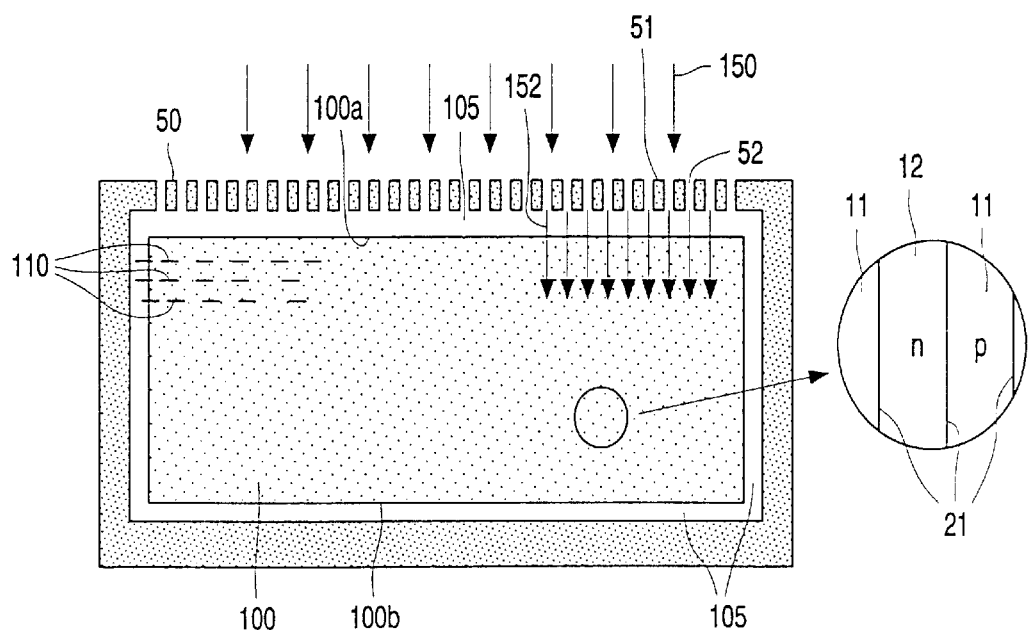
FIG. 2 is a cross-sectional view of a wafer of semiconductor material at a stage in its fabrication for the device of FIG. 1.

The mask 50 may be composed of, for example, known neutron-absorbing materials such as those disclosed in U.S. Pat. No. 4,728,371. It may be a contact mask 50 placed over the surface 100a of the body 100. Alternatively, as disclosed in U.S. Pat. No. 4,728,371, it may be a photolithographically-defined masking pattern 50 of the neutron-absorbing material deposited on, for example, a protective layer 105 of silicon dioxide on the body surfaces. The pattern of masking areas 51 and window areas 52 is chosen to give the desired layout pattern of alternating regions 11,12 that extends through the thickness of the body 100, for example stripes or rods/columns or a grid, as depicted in FIGS. 2 to 4 of U.S. Pat. No. 5,438,215.

The widths of the masking areas 51 and window areas 52 are chosen to give the necessary space-charge balance in $cm^{-2}$ between the regions 11,12 when depleted. Thus, the width w1, w2 and doping concentration Na, Nd of the regions 11,12 are made such that (when depleted) the space charge per unit area (Na.w1) and (Nd.w2) formed in each of these regions is effectively matched, i.e. balanced to the extent that an electric field resulting from any imbalance is less than the critical field strength at which avalanche breakdown would occur in the silicon semiconductor material. The doping concentration Na of the p-type regions 11 is determined by that of the body 100 as provided and is of a low magnitude in order to permit the desired RESURF depletion. This low doping concentration Na of, for example, boron has a negligible effect on the thermal neutron beams 152, even though boron is normally considered to be an absorber of thermal neutrons. The neutron transmutation of the silicon atoms results in a well defined and controllable n-type doping concentration Nd for the regions 12 at the window areas 51, as determined by the magnitude of the neutron flux and the irradiation time. The regions 12 are narrow, with a width w2. It is therefore important that the neutrons 150 entering the silicon body 100 through the window areas 52 are in the form of well-defined narrow rectilinear beams 152, unlike the transmutation process disclosed in U.S. Pat. No. 4,728,371 which uses a neutron "gas".

The well-defined narrow rectilinear beams 152 can be provided by directional selection from the neutron flux in a nuclear reactor chamber, using long narrow windows in a neutron-absorbing mask. A primary selection can be achieved at source, by making the entrance window into the irradiation chamber much longer than its width. Thus, the entrance window may be a tunnel so as to transmit only the neutrons travelling in that direction. A refinement of the rectilinear direction can be effected at the mask 50 over the body surface 100a. When mask 50 is a thick contact mask rather than a thin deposited layer, it may play the major role in selecting the neutrons. The neutron flux resulting from the collimating selection is lower in magnitude, and so much longer irradiation times may be needed to perform the present invention, as compared with the prior-art process with a neutron gas in U.S. Pat. No. 4,728,371. However, the longer irradiation times permit a more precise control of the resulting phosphorus doping concentration, which is important in achieving an adequate space-charge balance between the p-type and n-type regions 11 and 12.

Severe crystal lattice damage normally accompanies the neutron transmutation doping process. However, this lattice damage of the crystal body 100 can be annealed satisfactorily by a heating treatment without the occurrence of significant dopant diffusion between the regions 11 and 12. Thus, after irradiation, the body 100 can be annealed by heating to temperatures in the range of 650° C. to 800° C. for about 1 hour or more. This separate annealing stage may be omitted when the subsequent device manufacture involves suitable heat treatments, for example a dopant diffusion stage which could also anneal the damage.

The irradiated silicon body 100 can have quite a large thickness, dependent on the collimation of the neutron beam 152 entering the silicon, the thickness and blocking capability of the mask 50, and the divergence of the beam 152 within the body 100 due to scattering. The decay length of thermal neutrons in silicon is about 19 cm. A body thickness of, for example, 1 cm can give a deviation of about 5% in the phosphorus doping concentration from the front surface 100a to the back surface 100b.

After removal from the irradiation chamber, the thick body 100 is sliced to produce thin wafers suitable for device fabrication. Thus, the thick body 100 can be sawn along planes 110 (parallel to the major surfaces 100a and 100b and transverse to the p-n junctions 21) and its surfaces subsequently polished.

However, the body 100 may be thinner, for example, when the mask 50 is of the deposited layer type. The consequences of beam divergence due to scattering also reduces as the body thickness is reduced. Thus, for example, the irradiated body 100 may be, for example, less than 1 mm thick between its major surfaces 100a and 100b. The body 100 may even be a wafer of suitable thickness for device manufacture.

The resulting wafers with their alternating regions 11 and 12 are then further processed to provide the drain region 3 at one major face and the source and body regions 2 and 4 at the opposite major face. These regions 2, 3 and 4 may be formed by dopant implantation and diffusion into the wafer. However, long diffusion times cannot be used without also diffusing the doping concentrations Na and Nd of the multiple RESURF regions 11 and 12. Thus, if a thicker drain region 3 is desired, then an appropriately doped n-type wafer may be directly-bonded to the face 10b of the wafer 11,12 to provide the drain region 3. Thus, depending on how the region 3 is provided, the major face 10b of the body portion 10 may be the bottom surface of the device body or the interface with the region 3. In order to illustrate both of these alternatives, the reference 10b is shown with two dashed lead-lines in FIG. 1.

In some devices, it may not be necessary to align the source region 2 and channel-accommodating body region 4 with respect to the p-type and n-type regions 11 and 12 at the major face 10a of the body portion 10. This can be the case when the regions 2 and 4 have a longitudinal layout that is orientated transverse to a longitudinal layout of the regions 11 and 12 and/or when using a very large number of very narrow regions 11 and 12.

In other devices, for example with a close-packed hexagonal or square cellular layout for the regions 2 and 4, it may be desirable to align the regions 2 and 4 with respect to the regions 11 and 12. In this case, it is necessary to identify the locations of the p-type and n-type regions 11 and 12 at the major face 10a before providing the source region 2 and channel-accommodating body region 4 adjacent the major face 10a.

This location identification can be achieved in a variety of ways. Thus, for example, an orientation marker may be present in the mask 50 and may be used to provide an alignment mark on the wafer 100, for example by etching at a marker window in the mask 50. Alternatively, the orientation marker in the mask 50 may be aligned with an alignment marker already present in the wafer 100, for example an alignment flat in the perimeter of the wafer 100.

Lightly etching the face 10a in a selective etchant is a particularly convenient means of revealing the locations of the p-type and n-type regions 11 and 12 at face 10a. The etchant may be such as to etch preferentially p-type conductivity material or to etch preferentially the material damaged by the neutron irradiation.

In one or other of these ways, the locations of the p-type and n-type regions 11 and 12 at the face 10a can be identified. The insulated gate 34 may then be aligned with respect to the p-type and n-type regions 11 and 12 at said one major face 10a and may act subsequently as an implantation mask for providing the source region 2 and the channel-accommodating body region 4.

The thickness X of the multiple RESURF body portion 10 (i.e. the length of the alternating regions 11 and 12 between the blocking junction 40 and the interface with the drain region 3) is chosen in accordance with the desired blocking capability of the device, which is generally in excess of 100V. The invention becomes even more useful for even higher blocking voltages, for example at least 500V. For a 500V device the thickness X of the region 10 may typically be 50 $\mu$m. A thickness X of 350 $\mu$m could be used to make a MOSFET of 4.5 kV blocking capability. The balance in net charge (Na.w1−Nd.w2) of the regions 11 and 12 may be, for example, within ±10%, and the width w1 of the p-type regions 11 may be in the range 5 $\mu$m to 10 $\mu$m. For greater tolerance in fabricating the material of the body portion 10, it is preferable for the n-type regions 12 to have a higher donor concentration Nd than the acceptor concentration Na of the p-type regions 11. In this case, the width w2 of the n-type regions 12 between the p-n junctions 21 is correspondingly less than the width w1 of the p-type regions 11 between the p-n junctions 21. Thus, for example, the neutron irradiation may even be continued until Nd is an order of magnitude greater than Na, in which case the dimensions of mask areas 51 and 52 are chosen to provide w1 an order of magnitude greater than w2.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein. Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention. The Applicants hereby give notice that new claims may be formulated to any such features and/or combinations of such features during the prosecution of the present Application or of any further Application derived therefrom.

What is claimed is:

1. A method of fabricating a semiconductor wafer of a depletable multiple-region semiconductor material in the form of alternating p-type and n-type regions which together provide a voltage-sustaining space-charge zone when depleted, the method including the steps of:

(a) providing a p-type silicon body having an acceptor doping concentration extending through the thickness of the body between opposite major surfaces of the body, which acceptor doping concentration corresponds to that required for the p-type regions of the material, (b) providing a neutron-absorbing mask over one of the major surfaces to mask areas of the silicon body where the p-type regions are to be left, the mask having window areas where the n-type regions are desired, the window areas alternating with the masking areas;

(c) subjecting the silicon body to irradiation with collimated beams of thermal neutrons at the window areas in the mask so as to form the donor dopant concentration for the n-type regions by transmutation of silicon atoms into phosphorus, which donor dopant concentration extends across the thickness of the body between the opposite major surfaces of the body so that p-n junctions formed between the alternating p-type and n-type regions terminate at the opposite major surfaces of the body; and (d) wherein the neutron irradiation is continued until the resulting n-type regions with a width w2 have a donor dopant concentration Nd that is correspondingly higher than the acceptor doping concentration Na to satisfy, to within ±10%, a net charge balance relationship Na.w1=Nd.w2 between the alternating p-type and n-type regions, where w1 is the width of the p-type regions, and the width w2 is less than the width w1.

2. A method as claimed in claim 1, wherein, after the neutron transmutation doping step, the method includes a further step of slicing the silicon body transverse to the p-n junctions between the p-type and n-type regions so as to form a wafer as a thinner body for device manufacture.

3. A method as claimed in claim 1, wherein the collimate beams are well-defined narrow rectilinear beams.

4. A method of manufacturing a high voltage MOSFET device with a wafer fabricated by a method as claimed in claim 1 wherein source and drain regions are provided adjacent respective first and second opposite major faces of the wafer, the source region being separated from the multiple p-n junctions of the space-charge zone by a channel-accommodating body region of opposite conductivity type to the drain region.

5. A method as claimed in claim 4 further comprising the step, after said transmutation, of bonding a wafer of a first conductivity type to the second major surface of the wafer so as to provide the drain region at said second major surface.

6. A method as claimed in claim 4, further comprising the step of identifying the locations of the p-type and n-type regions at the first major face of the wafer before providing the source region and channel-accommodating body region adjacent to said first major face, and wherein the source region and channel-accommodating body region are aligned with respect to the p-type and n-type regions at said first major face.

7. A method as claimed in claim 6, wherein the locations of the p-type and n-type regions at the first major face of the wafer are indicated by lightly etching said first major face in a selective etchant.

8. A method as claimed in claim 4, wherein dopant of an opposite conductivity type is introduced into a portion of the wafer adjacent the first major surface to provide the channel-accommodating body region.

* * * * *